(12) United States Patent
Singidi et al.

(10) Patent No.: US 10,658,047 B1
(45) Date of Patent: May 19, 2020

(54) IMPLEMENTING STICKY READ USING ERROR CONTROL SUCCESS RATE ASSOCIATED WITH A MEMORY SUB-SYSTEM

(71) Applicant: Micron Technology, Inc., Boise, ID (US)

(72) Inventors: Harish Singidi, Fremont, CA (US); Kishore Muchherla, Fremont, CA (US); Ashutosh Malshe, Fremont, CA (US); Vamsi Rayaprolu, San Jose, CA (US); Sampath Ratnam, Boise, ID (US); Renato Padilla, Jr., Folsom, CA (US); Michael Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/177,193

(22) Filed: Oct. 31, 2018

(51) Int. Cl.
| G11C 7/10 | (2006.01) |
| G11C 16/26 | (2006.01) |
| G11C 16/34 | (2006.01) |
| G11C 29/52 | (2006.01) |
| G11C 7/04 | (2006.01) |
| G11C 29/42 | (2006.01) |

(52) U.S. Cl.
CPC .............. G11C 16/26 (2013.01); G11C 7/04 (2013.01); G11C 7/1045 (2013.01); G11C 7/1072 (2013.01); G11C 16/3404 (2013.01); G11C 29/42 (2013.01); G11C 29/52 (2013.01); G11C 2207/2254 (2013.01)

(58) Field of Classification Search
CPC ......... G11C 16/26; G11C 7/04; G11C 7/1045; G11C 7/1072

USPC ....................................................... 365/189.05
See application file for complete search history.

(56) References Cited

U.S. PATENT DOCUMENTS

| 6,963,505 | B2 * | 11/2005 | Cohen ................. G06F 11/1008 |
| | | | 365/185.03 |
| 6,992,932 | B2 * | 1/2006 | Cohen ................. G11C 11/5642 |
| | | | 365/185.2 |
| 9,208,022 | B2 * | 12/2015 | Leem .................. G06F 11/1048 |

(Continued)

OTHER PUBLICATIONS

PCT Notification of Transmittal of the International Search Report and the Written Opinion of the International Searching Authority for PCT Application No. PCT/US2019/058955, dated Feb. 24, 2020, 11 pages.

*Primary Examiner* — Vu A Le
(74) *Attorney, Agent, or Firm* — Lowenstein Sandler LLP

(57) ABSTRACT

A memory sub-system can be determined to be operating within a target operating characteristic based on a threshold success rate associated with error control operations using a particular parameter. Upon determining that the memory sub-system is operating within the target operating characteristic, a sticky read mode is entered by performing subsequent read operations using the particular parameter. It is determined that additional error control operations are triggered for at least a first threshold number of read operations using the particular parameter during the sticky read mode. Upon determining that the additional error control operations are triggered for at least the first threshold number of read operations using the particular parameter during the sticky read mode, the sticky read mode is exited by performing further read operations using a default parameter associated with the memory sub-system.

20 Claims, 5 Drawing Sheets

(56) References Cited

U.S. PATENT DOCUMENTS

| | | |
|---|---|---|
| 2013/0191704 A1 | 7/2013 | Eleftheriou et al. |
| 2013/0343131 A1 | 12/2013 | Wu et al. |
| 2017/0162270 A1 | 6/2017 | Park et al. |
| 2017/0236592 A1 | 8/2017 | Alhussien et al. |
| 2018/0102146 A1 | 4/2018 | Varanasi |

* cited by examiner

| Read Cycle | R1 | R2 | R3 | R4 | R5 | R6 | R7 | R8 | R9 | R10 | R11 | R12 | R13 | ... |
|---|---|---|---|---|---|---|---|---|---|---|---|---|---|---|
| Error Control Triggered? | Y | Y | N | Y | Y | N | Y | Y | Y | N | Y | Y | Y | ... |
| Offset Level 1 Successful? | Y | N | - | Y | Y | - | Y | N | Y | - | Y | Y | N | ... |
| Offset Level 2 Successful? | - | Y | - | - | - | - | - | N | - | - | - | - | Y | ... |
| Offset Level 3 Successful? | - | - | - | - | - | - | - | Y | - | - | - | - | - | ... |

FIG. 2A

| Read Cycle | ... | R31 | R32 | R33 | R34 | R35 | R36 | R37 | R38 | R39 | R40 |
|---|---|---|---|---|---|---|---|---|---|---|---|
| Error Control Triggered? | ... | Y | Y | N | N | Y | N | Y | N | Y | Y |

IMPLEMENTING STICKY READ USING ERROR CONTROL SUCCESS RATE ASSOCIATED WITH A MEMORY SUB-SYSTEM

TECHNICAL FIELD

Embodiments of the disclosure relate generally to memory sub-systems, and more specifically, relate to implementing sticky read using error control success rate associated with a memory sub-system.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 2A illustrates an example scenario for enabling sticky read using error control success rate associated with a memory sub-system in accordance with some embodiments of the present disclosure.

FIG. 2B illustrates an example scenario for exiting sticky read in accordance with some embodiments of the present disclosure.

DETAILED DESCRIPTION

Figure 1:
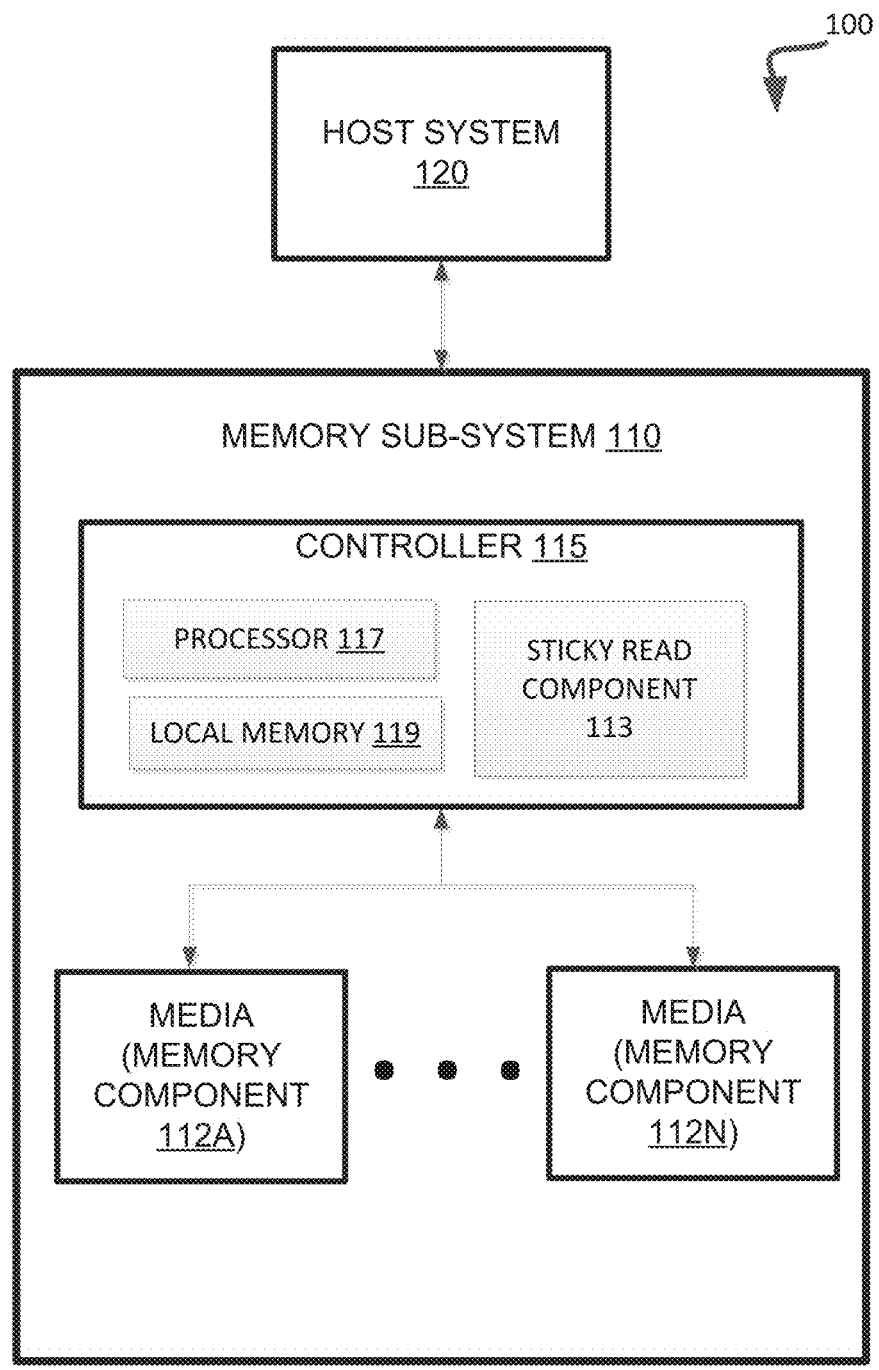
FIG. 1 illustrates an example computing environment that includes a memory sub-system in accordance with some embodiments of the present disclosure.

Aspects of the present disclosure are directed to the implementing sticky read using error control success rate associated with a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system. A "sticky read" refers to a read operation that is performed using a particular parameter (e.g., a particular threshold voltage, a particular read offset applied to a default threshold voltage, etc.), when the particular parameter is used for multiple consecutive read operations and the particular parameter is different from a default parameter (e.g., a default read setting, a calibrated read setting, etc.) associated with the memory sub-system. A "sticky read mode" refers to a mode of operation of the memory sub-system during which read operations are performed using a particular parameter when the particular parameter is used for multiple consecutive read operations and the particular parameter is different from a default parameter or a calibrated parameter associated with the memory sub-system. Further details regarding a particular parameter, a threshold voltage, a read offset, a default parameter, a default read setting, a calibrated read setting, etc. are described below.

The memory sub-system can include multiple memory components that can store data from the host system. The memory components can include memory cells that are used to store data. Each memory cell can store data values as a threshold voltage for that particular memory cell. Each distinct threshold voltage range corresponds to a predetermined value for the data stored at the memory cell. Conventional memory sub-systems can store multiple bits of data in a single memory cell by mapping sequences of bits of the data to the different threshold voltage ranges of the memory cell. The data can be stored into the memory cell by using a programming operation that applies a sequence of programming pulses to the memory cell. The sequence of programming pulses can be applied to the memory cell until a voltage level within a corresponding threshold voltage range has been reached at the memory cell. After the memory cell has been programmed, data can be read from the memory cell by applying a read threshold voltage to the memory cell at the corresponding threshold voltage range and translating the programmed voltage level at the memory cell.

The threshold voltage that is set for the memory sub-system at the beginning of the memory sub-system's life span or operation can be known as the default read setting or, sometimes, as the factory default read setting. Once the memory sub-system is in use, the default read setting can be adjusted (e.g., calibrated) over time based on scans of the memory sub-system and detecting changes in the environment of the memory sub-system based on various factors, such as data retention in particular portions of the memory sub-system, etc. Thus, over time and observance of repeated activities, the factory default read setting can be set to a calibrated read setting. Calibrated read settings are set after a substantial period (e.g., 1-2 days, etc.) of observance of the usage of the memory sub-system.

A memory sub-system can be subjected to targeted test cases where the memory sub-system is tested for various types of performance criteria. Targeted test cases can include cross temperature testing, data retention testing, read disturb testing, etc. During execution of a targeted test case, the memory sub-system is generally tested under certain conditions repeatedly within a short period of time (e.g., 1-2 hours, etc.). A read disturb error occurs when a read to a particular location (e.g., one row of a memory cell of a block) of the memory sub-system impacts the threshold voltages of unread adjacent locations (e.g., different rows of the same block). Data retention issues can also occur when memory sub-system is operated in a high temperature as the memory cells lose charges over time operating in hot temperature.

A cross temperature testing can include operating the memory sub-system in an environment with widely varying temperatures. For example, data can be programmed at one temperature and read at an extremely different temperature to assess performance. For example, if data is programmed at −20° C. and read at 85° C., then the default threshold voltage cannot retrieve the data successfully, because the voltage level associated with a memory cell can shift from being detected at a particular read threshold voltage as the temperature of the memory sub-system changes. The voltage level shift per degree Celsius can be larger at extreme temperatures (e.g., closer to 0° C. or 70° C.) than it is in a more moderate range (e.g., 15° C. to 30° C.). Also, voltage level shift can be different based on the direction of the temperature change. That is, if data is written at a low temperature and read at an extremely different, high temperature, there can be one voltage level shift, whereas if data is written at a high temperature and read at a low temperature, the voltage level shift can be different. Thus, a particular setting cannot be used to address the different types of cross temperature testing.

During these targeted test cases, factory default read settings or the calibrated read settings are not usually optimal read settings. An optimal read setting is a read setting that can retrieve programmed data successfully. Generally, since targeted test cases run for a short duration, calibrated read settings cannot converge to an optimal read setting that can successfully retrieve data. As such, in an environment where the memory sub-system is subjected to extreme conditions for a short duration of time, such as during targeted test cases, and the factory default read setting or the calibrated read setting does not recover the desired data, the memory sub-system can enter an error handling flow to recover data.

While in an error handling flow, a conventional memory sub-system can implement an error detection and correction (i.e., an error control) operation for the data that is stored at and/or retrieved from the memory components of the memory sub-system. The error can be detected and corrected based on an error correction/handling operation. The error correction/handling operation can include one or more read retries using different parameters, such as a change in voltage threshold, as the initial read operation performed on the memory cell. The error correction/handling operation can also use hard information that corresponds to the bit values (e.g., a 0 or a 1) read from a memory cell and soft information that corresponds to a probability that the hard information read from the memory cell is correct to correct the bit values stored at a memory cell. Error handling operation can be time consuming and impact performance of the memory sub-system. The more frequently error handling operation is triggered, the slower the performance of the memory system. Also, the particular location of memory sub-system that enters error handling flow is blocked from taking other commands from the host, resulting in reduced availability of the memory sub-system to perform other read operations or write operations. Thus, lowering the error handling trigger is advantageous.

Aspects of the present disclosure address the above and other deficiencies by determining that the memory sub-system is operating within a target operating characteristics and by implementing sticky read using error control success rate associated with the memory sub-system. A determination can be made that the memory sub-system is operating within a target operating characteristic based on a threshold success rate associated with multiple error control operations when using a particular parameter. Once it is determined that the memory sub-system is operating within the target operating characteristic, a sticky read mode can be entered by performing subsequent read operations using the particular parameter. While using the sticky read mode, it can be determined that additional error control operations are triggered for at least a first threshold number of read operations using the particular parameter during the sticky read mode. Once it is determined that the additional error control operations are triggered for at least the first threshold number of read operations using the particular parameter during the sticky read mode, the sticky read mode can be exited by performing further read operations using a default parameter associated with the memory sub-system.

The present disclosure reduces or eliminates the effects of extreme operating conditions for the memory sub-system, such as extreme temperature differences, repeated data reads, etc. Advantages of the present disclosure include, but are not limited to, the increased performance of the memory sub-system as operations can be performed more efficiently and optimally, minimizing latency and reducing computing resources that are used to perform error correction operations. As a result, the error rate in the memory sub-system can be decreased or eliminated. Accordingly, error correction operations can be utilized less frequently, and the overall performance of the memory sub-system can be improved as other read operations or write operations can be performed by the memory sub-system instead of additional error correction operations.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a sticky read component 113 that can be used to determine that the memory sub-system 110 is operating within a target operating characteristics and implement sticky read using error control success rate associated with the memory sub-system 110. In some embodiments, the controller 115 includes at least a portion of the sticky read component 113. For example, the controller 115 can include a processor 117 (processing device) configured to execute instructions stored in local memory 119 for performing the operations described herein. In some embodiments, the sticky read component 113 is part of the host system 110, an application, or an operating system.

The sticky read component 113 can determine that the memory sub-system 110 is operating within a target operating characteristic based on a threshold success rate associated with multiple error control operations when using a particular parameter. The sticky read component 113 can enter a sticky read mode by performing subsequent read operations using the particular parameter. If it is determined that additional error control operations are triggered for at least a first threshold number of read operations using the particular parameter during the sticky read mode, the sticky read mode can be exited by the sticky read component 113 by performing further read operations using a default parameter associated with the memory sub-system 110. Further details with regards to the operations of the sticky read component 113 are described below.

FIG. 2A illustrates an example scenario for enabling sticky read using error control success rate associated with memory sub-system 110 in accordance with some embodiments of the present disclosure. For example, the sticky read component 113 of FIG. 1 can enable the sticky read using the error control success rate. In some embodiments, the sticky read component 113 can be configured to determine that the memory sub-system 110 is operating within a target operating characteristic. For example, target operating characteristics can include characteristics of the memory sub system during a targeted test case, such as, cross temperature testing, data retention testing, read disturb testing, etc. In one example, the target operating characteristic can correspond to a first threshold range of temperature condition and a second threshold range of temperature condition associated with the memory sub-system 110. As an example, the first threshold range of temperature condition can be a temperature value below 10° C., and the second threshold range of temperature condition can be a temperature value above 80° C. In one example, user data can be written to the memory a memory component of the memory sub-system 110 during the first threshold temperature condition (e.g., below 10° C.) and user data can be read from the memory component during the second threshold range of temperature condition (e.g., above 80° C.). In another example, user data can be written to the memory a memory component of the memory sub-system 110 during the second threshold temperature condition (e.g., above 80° C.) and user data can be read from the memory component during the first threshold range of temperature condition (e.g., below 10° C.).

In some embodiments, the sticky read component 113 can be configured to determine that the memory sub-system 110 is operating within a target operating characteristic based on a threshold success rate associated with multiple error control operations using a particular parameter. In some examples, the particular parameter can be a particular voltage level (e.g., 1.1 volts). In some examples, the particular parameter can be an offset value (e.g., a read offset) added to a threshold voltage. For example, a default read setting can correspond to a threshold voltage of 1 volt to read user data. A read offset of 0.1 can be added to the threshold voltage of 1 volt such that a total of 1.1 volt is applied to read the user data. In some scenarios, due to some special conditions or anomalies associated with the memory sub-system, a default read setting cannot retrieve the user data. For example, applying a default read setting with threshold voltage of 1 volt can be configured to retrieve a programmed user data value of "1." However, in some scenarios, applying a default read setting with threshold voltage of 1 volt can retrieve a user data value that is not equal to "1," instead, it can retrieve a value such as "0." Thus, applying a default read setting can lead to retrieving an erroneous data value in some cases. In such a situation, the memory sub-system 110 can trigger an error handling flow using an error control operation to retrieve the correct programmed user data of "1."

An error control operation can include one or more steps using one or more parameters. For example, a first step of the error handling flow can include applying a first parameter, such as, a first read offset value to the default read setting (e.g., a threshold voltage). If the application of the first read offset value successfully retrieves the programmed user data, the error control operation is exited and no further steps are applied. However, if the first step of the error handling operation does not successfully retrieve the programmed user data, the error control operation can continue to a second step. The second step can include applying a second read offset value to the default read setting. The error control operation can continue by applying different read offset values until the programmed user data is successfully retrieved.

The sticky read component 113 can keep track of statistics such as the number of read cycles performed, the number of times error control operations triggered out of the read cycles performed, the parameters (e.g., offset values) applied to retrieve the user data, and the success rate of the parameters applied in retrieving user data. In an example, a success rate can include the number of times each of the applied parameters retrieves the user data successfully. In the case of an anomaly or an exceptional condition of the memory sub-system causing an error, the parameters that successfully retrieve user data can vary widely. If the memory sub-system enters error control operations frequently during consecutive read cycles, and a particular offset frequently and successfully retrieves user data during the error correction operations, it can be an indication that the error condition is triggered due to the memory sub-system operating under target operations characteristics instead of an anomaly or an exceptional condition of the memory sub-system. Accordingly, the sticky read component 113 can determine that the memory sub-system 110 is operating within a target operating characteristic based on a threshold success rate associated with multiple error control operations using a particular parameter.

FIG. 2A shows an example scenario when the sticky read component 113 tracks and uses various statistics using a data structure such as table 200 to determine that the memory sub-system 110 is operating within a target operating characteristic. In the example, row 210 of table 200 tracks the read cycles performed by the memory sub-system 110, denoting read cycles as R1, R2, through R13, etc. Row 220 identifies, for each read cycle, whether error control operation is triggered. The values for the row include "Y" for "yes" when error control operation is triggered for a particular read cycle, and "N" for "no" when error control operation is not triggered for a particular read cycle. Rows 230 to 250 identifies whether a parameter is successful at retrieving user data. For example, row 230 identifies whether a parameter corresponding to "Offset Level 1" successfully retrieves user data while applying the offset level during an error control operation. In an example, offset level 1 can correspond to an offset value of 0.1 volts added to a default read voltage. The values for rows 230-250 include "Y" for "yes" when the corresponding offset level successfully retrieves user data during error control operation for a particular read cycle, and "N" for "no" when the corresponding offset level does not successfully retrieve user data during error control operation for a particular read cycle. Each time an error control operation is triggered, an offset value is used in an attempt to retrieve the user data. For example, for read cycle R1, as indicated by value "Y" in row 220, error control operation is triggered. As a first step of the error control operation, offset level 1 (e.g., offset value of 0.1 volts) is applied. In the example, for read cycle R1, offset level 1 successfully retrieves user data, as indicated by the value "Y" in row 230. As such, no further steps of the error control operations are applied and the error control operation is exited. For read cycle R2, error control operation is triggered, and offset level 1 is applied at the first step, however, the user data is not successfully retrieved as indicated by the value "N" in row 230. Thus, a second step of the error control operation is applied using offset level 2 (e.g., offset value of 0.2 volts) and indicated as being successful in retrieving the user data. As such, for read cycle R2, a third step is not performed. For read cycle R3, an error control operation is not triggered, and as such no offset level is applied. For read cycle R8, neither of offset level 1 or offset level 1 successfully retrieves user data, however, offset level 3 (e.g., offset value of 0.3 volts) is indicated as retrieving the user data successfully. These statistics available in table 200 can be used to determine whether the memory sub-system 110 is operating within a target operating characteristic.

Sticky read component 113 can define a threshold success rate associated with the parameters (e.g., read offset) based on which it can be identified whether the memory sub-system 110 is operating within a target operating characteristic. In one example, the threshold success rate can correspond to a particular read offset retrieving user data for at least a first threshold number of error control operations. For example, a threshold number of error control operations can be set as "N" where the value of "N" is "7." As such, if any particular read offset, such as offset level 1, retrieves user data for at least 7 error control operations, then the sticky read component 113 can indicate that the memory sub-system is operating within a target operating characteristics.

In another example, the threshold success rate can be defined as a particular read offset retrieving user data for at least a first threshold number of error control operations out of a specified number of error control operations. For example, a threshold number of error control operations can be set as "N" where the value of "N" is "7" and a specified number of error control operations can be set as "M" where the value of "M" is set as "10." As such, if any particular read offset, such as offset level 1, retrieves user data for at least 7 error control operations out of 10 error control operations, then the sticky read component 113 can indicate that the memory sub-system is operating within a target operating characteristics. In some examples, the specified number of error control operations can be consecutive error control operations. For example, the 10 error control operations can be consecutive error control operations. In case none of the parameters applied successfully retrieves the user data for at least 7 error control operations out of 10 consecutive error control operations, then the sticky read component can assess the error control statistics for the next read cycle and determine if the threshold success rate is achieved. Unless the threshold success rate is achieved, the sticky read component continues to assess success rates for subsequent read cycles. Once it is determined that the threshold success rate is achieved, the sticky read component 113 can determine that the memory sub-system is operating under target operating characteristics. The value for the threshold error control operations and specified error control operations can be set based on empirical data obtained by performing various experimentations related to target operating characteristics. The empirical data can correlate to number of successful error control operations while memory sub-system operates within a target operating characteristic.

Following the example values for the threshold error control operations "N" set as 7 and specified error control operations "M" set as 10, FIG. 2A shows that after performing read cycle R13, the specified number of 10 error control operations are triggered. Out of the specified number of 10 error control operations, offset level 1 retrieved data successfully for 7 error control operations, offset level 2 retrieved data successfully for 2 error control operations, and offset level 3 retrieved data successfully for 1 error control operation. Accordingly, offset level 1 successfully retrieved user data for at least for the threshold number of 7 error control operations. As such, sticky read component 113 determines that the memory sub-system is operating within a target operating characteristics based on achieving the threshold success rate associated with the error control operations using the particular parameter of offset level 1.

Upon determining that the memory sub-system is operating within the target operating characteristic, the sticky read component can cause the processor 117 to enter a sticky read mode by performing subsequent read operations using the particular parameter. Since it is determined that the particular parameter achieves the threshold success rate, it can be advantageous to use the particular parameter for subsequent read operations in order to avoid triggering further frequent error control operations. For as long as the memory sub-system operates within the target operating characteristics, using the particular parameter can retrieve almost all of the user data without triggering further error control operations. As such, the sticky read component 113 can set the read setting to the particular parameter (e.g., particular read offset applied to the default threshold voltage) instead of the default read setting (e.g., default factory read setting or the calibrated read setting). In the example, the default parameter of the threshold voltage value of 1 volt is different than the particular parameter using offset level 1 with the value 0.1 volts applied to the default threshold voltage of 1 volt, which is a total of 1.1 volts. Using the example of FIG. 2A, once it is determined that the memory sub-system 110 is operating within the target operating characteristic after performing read cycle R13 using the particular parameter of offset level 1, a sticky read mode can be entered by performing subsequent read operations after read cycle R13 using the particular parameter of offset level 1. As such, each read operation after read cycle R13 is performed using offset level 1.

FIG. 2B illustrates an example scenario for exiting sticky read mode associated with the memory sub-system. In an embodiment, the sticky read component 113 can also keep track of additional statistics detecting the number of additional error control operations that are triggered after entering the sticky read mode. Based on the additional statistics, the sticky read component 113 can determine that additional error control operations are triggered for at least for a threshold number of read operations using the particular parameter during the sticky read mode. In some examples, the threshold number of read operations can be achieved out of a specified number of read operations. If error control operations are triggered for a defined threshold number of read operations even after using the particular parameter, then it can be an indication that the particular parameter is no longer effective in retrieving the user data successfully. This can be an indication that the memory sub-system is no longer operating within the target operating characteristics. As such, the sticky read mode can be exited and further read operations can be performed using the default parameter (e.g., the factory default read setting, or the calibrated read setting) associated with the memory sub-system.

Sticky read component 113 can define a threshold number of read operations based on which it can be determined whether to exit the sticky read mode. In one example, the threshold number of read operations can correspond to the particular read offset triggering additional error control operations for the threshold number of read operations. For example, a threshold number of number of read operations can be set as "X." In an example, the value of "X" can be set as "6." As such, if the particular read offset used during sticky read mode (e.g., offset level 1) triggers additional error operations for at least 6 read operations, then the sticky read component 113 can indicate that the memory sub-system is no longer operating within a target operating characteristics and cause the processor 117 to exit the sticky read mode.

In another example, the threshold number of read operations can be achieved out of a specified number of read operations. That is, the sticky read component 113 can determine that the additional error control operations are triggered for at least for the threshold number of read operations out of a specified number of read operations using the particular parameter during the sticky read mode. For example, the specified number of read operations can be set as "Y." In an example, the value of "Y" can be set as "10." As such, if the particular read offset used during sticky read mode (e.g., offset level 1) triggers additional error operations for at least 6 read operations out of a specified number of 10 read operations, then the sticky read component 113 can indicate that the memory sub-system is no longer operating within a target operating characteristics and cause the processor 117 to exit the sticky read mode. In some examples, the specified number of read operations can be consecutive read operations, such as out of a specified number of 10 consecutive read operations. Once it is determined that additional error control operations are triggered for at least the threshold number of read operations using the particular parameter during the sticky read mode, the sticky read component 113 can determine to exit the sticky read mode by performing further read operations using a default parameter associated with the memory sub-system. The value for the threshold number of read operations and specified number of read operations can be set based on empirical data obtained by performing various experimentations related to target operating characteristics. The empirical data can correlate to number of additional error control operations triggered during sticky read mode while memory sub-system operates within a target operating characteristic.

FIG. 2B shows an example scenario when the sticky read component 113 tracks and uses additional statistics using a data structure such as table 260 to exit the sticky read mode. In some examples, table 260 can be a continuation of table 200. In some examples, table 260 can be a different table than table 200. In the example, row 270 of table 260 tracks the read cycles performed by the memory sub-system 110. Similar to table 200, in table 260, read cycles are denoted by R31, R32, through R40, etc. Row 270 identifies, for each read cycle, whether error control operation is triggered. The values for the row include "Y" for "yes" when error control operation is triggered for a particular read cycle, and "N" for "no" when error control operation is NOT triggered for a particular read cycle.

Continuing from the example of FIG. 2A, FIG. 2B shows additional statistics for detecting the number of additional error control operations that are triggered after entering the sticky read mode after read cycle R13. Starting with read cycle R31, additional error control operations are indicated as being triggered after the sticky read mode was entered. Multiple error control operations are triggered for multiple read cycles after read cycle R31, continuing up to read cycle R40. Following the example values for the threshold number of read operations "X" set as 6 and specified number of read operations "Y" set as "10," sticky read component 113 can determine that after performing read cycle R40, additional error control operations are triggered for the threshold number of 6 read operations (e.g., for read cycles R31, R32, R35, R37, R39, and R40) out of the specified number of 10 consecutive read operations (e.g., for read cycles R31-R40). Accordingly, the sticky read component 113 can determine that additional error control operations are triggered for at least for the threshold number of read operations (e.g., 6) out of the specified number of read operations (e.g., 10) using the particular parameter (e.g., offset level 1) during the sticky read mode. As such, the sticky read component 113 can cause the processor 117 to exit the sticky read mode by performing further read operations (e.g., read cycles after R40) using a default parameter associated with the memory sub-system. The default parameter can be different from the particular parameter (e.g., offset level 1) used during the sticky read mode. In an example, the default parameter can be a factory default read setting (e.g., threshold voltage of 1 volt) or a calibrated read setting (e.g., 1.05 volts).

Figure 3:
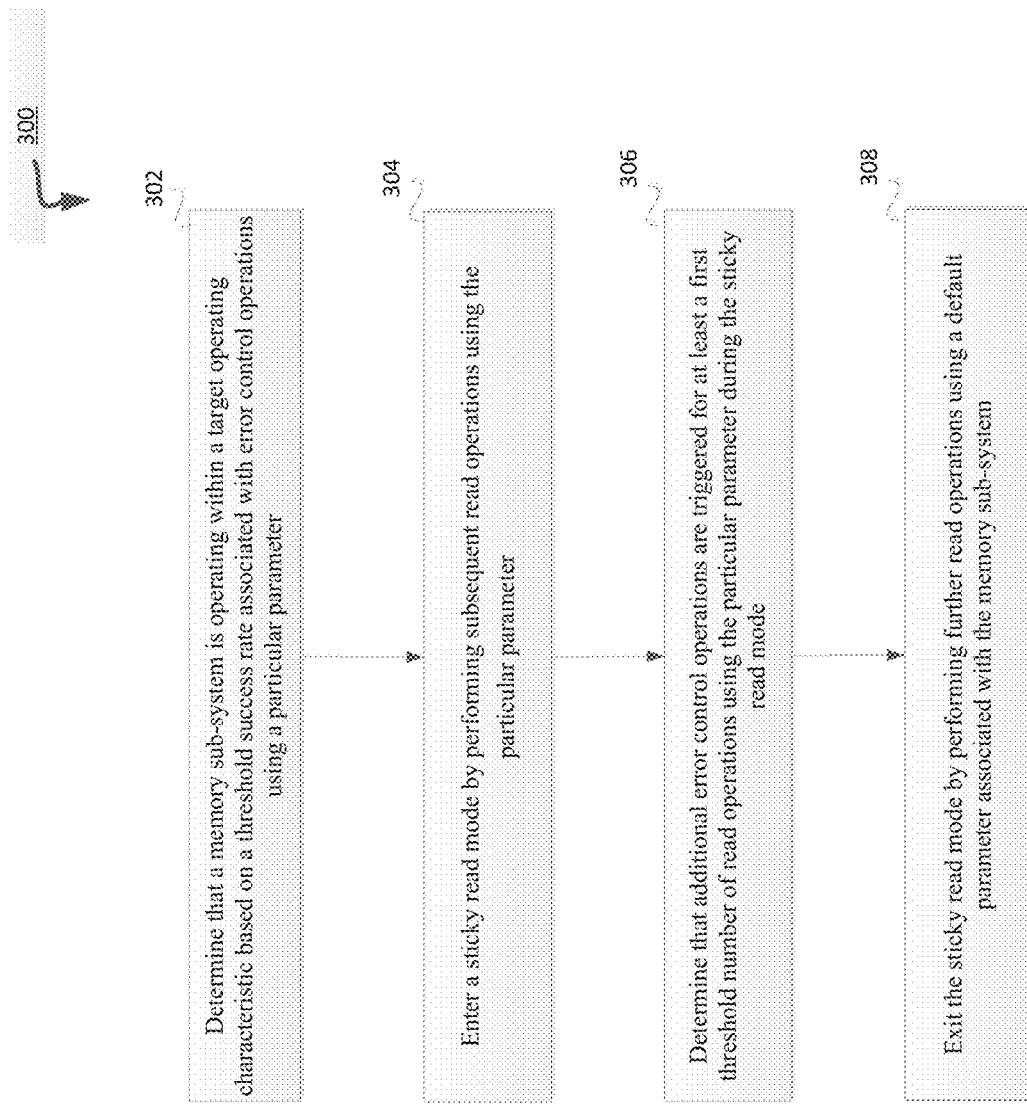
FIG. 3 is a flow diagram of an example method for implementing sticky read using error control success rate associated with a memory sub-system in accordance with some embodiments of the present disclosure.

FIG. 3 is a flow diagram of an example method 300 for implementing sticky read using error control success rate associated with a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the sticky read component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 302, the processing device determines that a memory sub-system is operating within a target operating characteristic. The determination can be based on a threshold success rate associated with multiple error control operations using a particular parameter. In some examples, the target operating characteristic can correspond to a first threshold range of temperature condition and a second threshold range of temperature condition associated with the memory sub-system. In one example, the first threshold range of temperature condition can be associated with the memory sub-system when user data is written to the memory component and the second threshold range of temperature condition can be associated with the memory sub-system when user data is read from the memory component. In another example, the second threshold range of temperature condition can be associated with the memory sub-system when user data is written to the memory component and the first threshold range of temperature condition can be associated with the memory sub-system when user data is read from the memory component. In some examples, in order determine that the memory sub-system is operating within the target operating characteristic based on the threshold success rate associated with multiple error control operations using the particular parameter, the processing device determines that the particular parameter retrieves user data for at least a second threshold number of error control operations out of the multiple error control operations while performing read operations.

At operation 304, the processing device enters a sticky read mode by performing subsequent read operations using the particular parameter. In some examples, the particular parameter can be a particular voltage level. In some examples, the particular parameter can be an offset value applied to a particular threshold voltage level.

At operation 306, the processing device determines that additional error control operations are triggered for at least a first threshold number of read operations using the particular parameter during the sticky read mode. In some examples, in order to determine that the additional error control operations are triggered for at least the threshold number of read operations using the particular parameter during the sticky read mode, the processing devicedetermines that the additional error control operations are triggered for at least the first threshold number of read operations out of a specified number of read operations using the particular parameter during the sticky read mode.

At operation 308, the processing device exits the sticky read mode by performing further read operations using a default parameter associated with the memory sub-system. In some embodiments, the particular parameter can be different than a default parameter. In some examples, the default parameter can be a factory default read setting. In some examples, the default parameter can be a calibrated read setting derived after using the factory default read setting over time.

Figure 4:
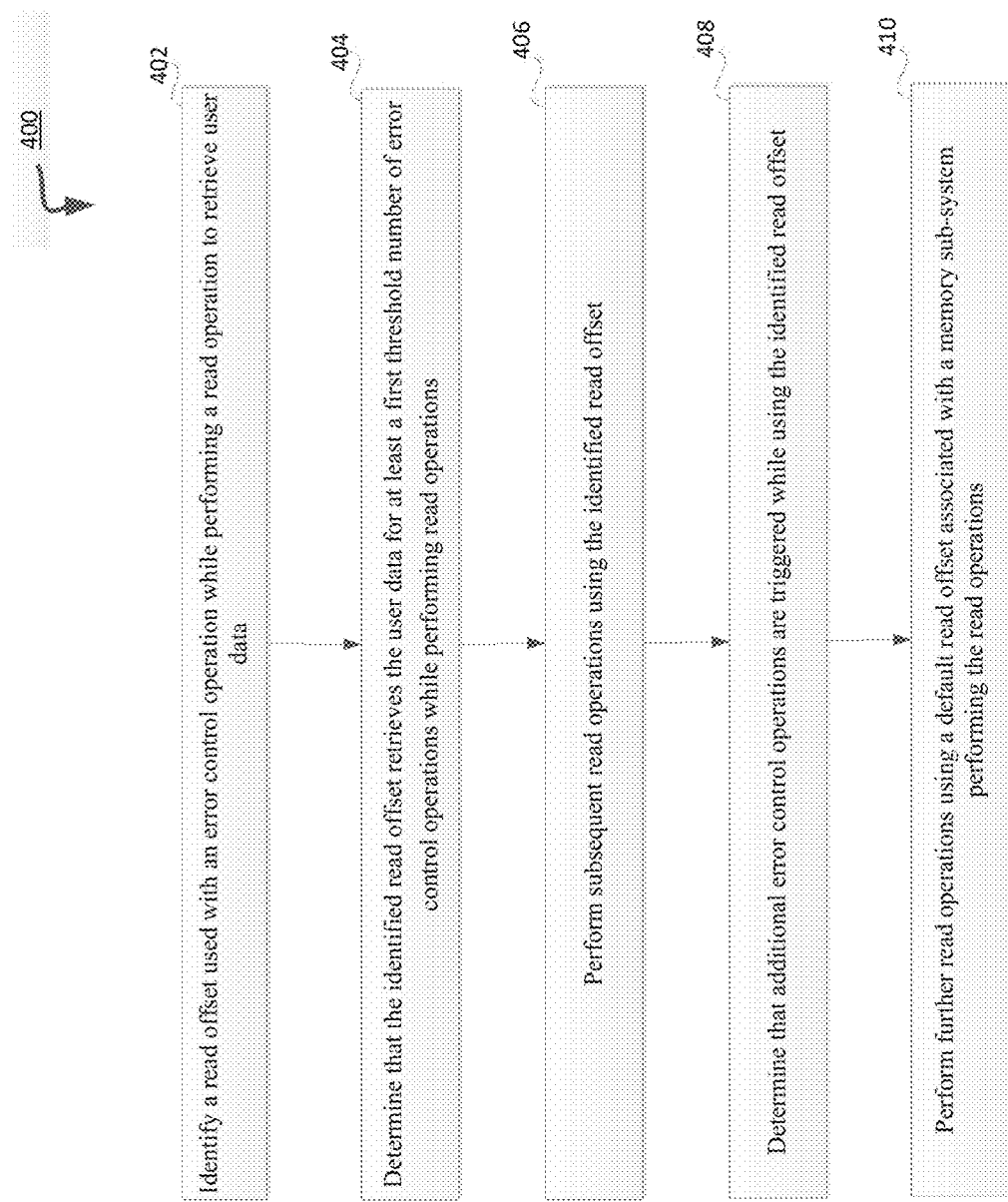
FIG. 4 is a flow diagram of an example method for using a read offset to successfully retrieve user data based on error control success rate associated with a memory sub-system in accordance with some embodiments of the present disclosure.

FIG. 4 is a flow diagram of an example method 400 for using a read offset to successfully retrieve user data based on error control success rate associated with a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the sticky read component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 402, the processing device identifies a read offset used with an error control operation while performing a read operation to retrieve user data. In some examples, the read offset can be based on a threshold voltage applied to a memory sub-system to retrieve the user data.

At operation 404, the processing device determines that the identified read offset retrieves the user data for at least a first threshold number of error control operations while performing read operations. In some examples, the identified read offset retrieves the user data for at least the first threshold number of error control operations out of a specified number of consecutive error control operations while performing read operations.

At operation 406, the processing device performs subsequent read operations using the identified read offset. In some examples, the identified read offset can be an offset value applied to a particular threshold voltage level.

At operation 408, the processing device determines that additional error control operations are triggered while using the identified read offset. In order to determine that the additional error control operations are triggered while using the identified read offset comprises, it can be determined that the additional error control operations are triggered for a second threshold number of read operations while using the identified read offset.

At operation 410, the processing device performs further read operations using a default read offset associated with a memory sub-system performing the read operations. In some examples, the default read offset can be different than the identified read offset. In some examples, the default read offset can be set to a calibrated read offset derived based on operation of the memory sub-system over a period of time.

Figure 5:
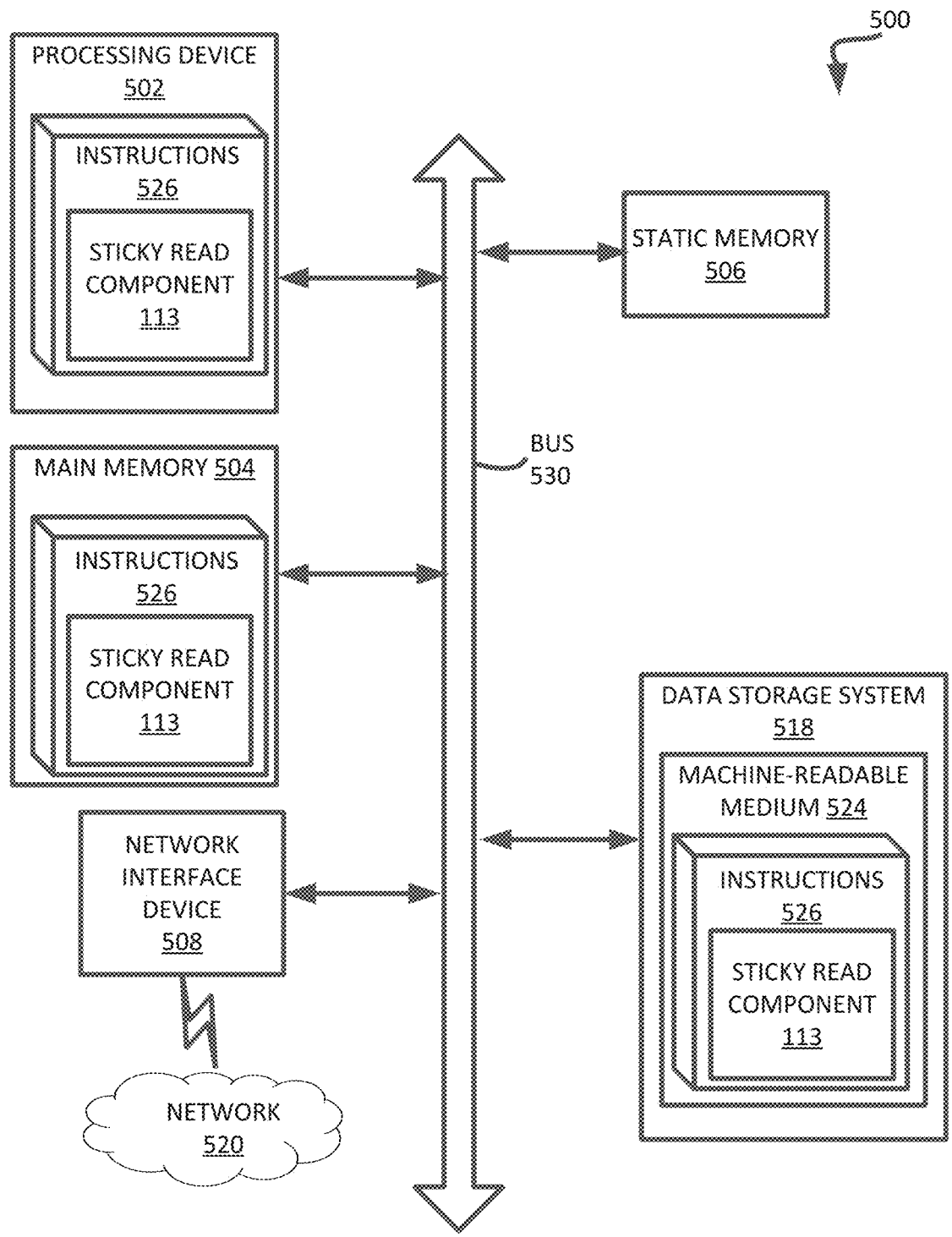
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sticky read component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a sticky read component (e.g., the sticky read component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to:
determine that a memory sub-system is operating within a target operating characteristic based on a threshold success rate associated with a plurality of error control operations using a particular parameter;
upon determining that the memory sub-system is operating within the target operating characteristic, enter a sticky read mode by performing subsequent read operations using the particular parameter;
determine that additional error control operations are triggered for at least a first threshold number of read operations using the particular parameter during the sticky read mode; and
upon determining that the additional error control operations are triggered for at least the first threshold number of read operations using the particular parameter during the sticky read mode, exit the sticky read mode by performing further read operations using a default parameter associated with the memory sub-system.

2. The system of claim 1, wherein the target operating characteristic corresponds to a first threshold range of temperature condition and a second threshold range of temperature condition associated with the memory sub-system.

3. The system of claim 2, wherein the first threshold range of temperature condition is associated with the memory sub-system when user data is written to the memory component and the second threshold range of temperature condition is associated with the memory sub-system when user data is read from the memory component.

4. The system of claim 2, wherein the second threshold range of temperature condition is associated with the memory sub-system when user data is written to the memory component and the first threshold range of temperature condition is associated with the memory sub-system when user data is read from the memory component.

5. The system of claim 1, wherein the particular parameter is different than the default parameter.

6. The system of claim 1, wherein to determine that the memory sub-system is operating within the target operating characteristic based on the threshold success rate associated with the plurality of error control operations using the particular parameter, the processing device is to:
   determine that the particular parameter retrieves user data for at least a second threshold number of error control operations out of the plurality of error control operations while performing read operations.

7. The system of claim 1, wherein to determine that the additional error control operations are triggered for at least the threshold number of read operations using the particular parameter during the sticky read mode, the processing device is to:
   determine that the additional error control operations are triggered for at least the first threshold number of read operations out of a specified number of read operations using the particular parameter during the sticky read mode.

8. A method comprising:
   identifying a read offset used with an error control operation while performing a read operation to retrieve user data;
   determining that the identified read offset retrieves the user data for at least a first threshold number of error control operations while performing read operations;
   upon determining that the identified read offset retrieves the user data for at least the first threshold number of error control operations while performing read operations, performing subsequent read operations using the identified read offset; and
   performing, by a processing device, further read operations using a default read offset associated with a memory sub-system performing the read operations upon determining that additional error control operations are triggered while using the identified read offset.

9. The method of claim 8, wherein determining that the identified read offset retrieves the user data for at least the first threshold number of error control operations while performing read operations comprises:
   determining that the identified read offset retrieves the user data for at least the first threshold number of error control operations out of a specified number of consecutive error control operations while performing read operations.

10. The method of claim 8, wherein the read offset is based on a threshold voltage applied to a memory sub-system to retrieve the user data.

11. The method of claim 8, wherein determining that the additional error control operations are triggered while using the identified read offset comprises:
   determining that the additional error control operations are triggered for a second threshold number of read operations while using the identified read offset.

12. The method of claim 8, wherein the default read offset is different than the identified read offset.

13. The method of claim 12, wherein the default read offset is set to a calibrated read offset derived based on operation of the memory sub-system over a period of time.

14. A non-transitory computer-readable storage medium comprising instructions that, when executed by a processing device, cause the processing device to:
   determine that a memory sub-system is operating within a target operating characteristic based on a threshold success rate associated with a plurality of error control operations using a particular parameter;
   upon determining that the memory sub-system is operating within the target operating characteristic, enter a sticky read mode by performing subsequent read operations using the particular parameter;
   determine that additional error control operations are triggered for at least a first threshold number of read operations using the particular parameter during the sticky read mode; and
   upon determining that the additional error control operations are triggered for at least the first threshold number of read operations using the particular parameter during the sticky read mode, exit the sticky read mode by performing further read operations using a default parameter associated with the memory sub-system.

15. The non-transitory computer-readable storage medium of claim 14, wherein the target operating characteristic corresponds to a first threshold range of temperature condition and a second threshold range of temperature condition associated with the memory sub-system.

16. The non-transitory computer-readable storage medium of claim 15, wherein the first threshold range of temperature condition is associated with the memory sub-system when user data is written to the memory sub-system and the second threshold range of temperature condition is associated with the memory sub-system when user data is read from the memory sub-system.

17. The non-transitory computer-readable storage medium of claim 15, wherein the second threshold range of temperature condition is associated with the memory sub-system when user data is written to the memory sub-system and the first threshold range of temperature condition is associated with the memory sub-system when user data is read from the memory sub-system.

18. The non-transitory computer-readable storage medium of claim 14, wherein the particular parameter is different than the default parameter.

19. The non-transitory computer-readable storage medium of claim 14, wherein to determine that the memory sub-system is operating within the target operating characteristic based on the threshold success rate associated with the plurality of error control operations using the particular parameter, the processing device is to:
   determine that the particular parameter retrieves user data for at least a second threshold number of error control operations out of the plurality of error control operations while performing read operations.

20. The non-transitory computer-readable storage medium of claim 14, wherein to determine that the additional error control operations are triggered for at least the first threshold number of read operations using the particular parameter during the sticky read mode, the processing device is to:
   determine that the additional error control operations are triggered for at least the first threshold number of read operations out of a specified number of read operations using the particular parameter during the sticky read mode.

* * * * *